(12) United States Patent
Morrell

(10) Patent No.: US 8,305,077 B2
(45) Date of Patent: Nov. 6, 2012

(54) PHASE SENSITIVE RADIO FREQUENCY MAPPING FOR MAGNETIC RESONANCE IMAGING

(75) Inventor: Glen Robert Morrell, Cottonwood Heights, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 561 days.

(21) Appl. No.: 12/498,326

(22) Filed: Jul. 6, 2009

(65) Prior Publication Data

US 2011/0001476 A1 Jan. 6, 2011

(51) Int. Cl.
*G01V 3/00* (2006.01)

(52) U.S. Cl. .................................... 324/309; 324/307

(58) Field of Classification Search .......... 324/300–322; 600/407–445
See application file for complete search history.

(56) References Cited

U.S. PATENT DOCUMENTS

| 5,019,784 | A | 5/1991 | Garwood et al. | |
| 5,798,643 | A | 8/1998 | Werthner | |
| 5,914,599 | A | 6/1999 | Sharp | |
| 6,049,206 | A | 4/2000 | Sharp | |
| 6,268,728 | B1 * | 7/2001 | Morrell | 324/307 |
| 6,288,541 | B1 * | 9/2001 | Dumoulin | 324/306 |
| 6,396,271 | B1 * | 5/2002 | Burl et al. | 324/318 |
| 6,472,872 | B1 * | 10/2002 | Jack et al. | 324/309 |
| 6,914,428 | B2 | 7/2005 | Dixon et al. | |
| 7,054,675 | B2 | 5/2006 | Ma et al. | |
| 7,202,668 | B2 * | 4/2007 | Ludwig et al. | 324/318 |
| 7,208,950 | B2 * | 4/2007 | Deimling | 324/309 |
| 7,254,435 | B2 | 8/2007 | Zhang et al. | |
| 7,268,554 | B2 * | 9/2007 | Vaughan | 324/322 |
| 7,408,346 | B2 * | 8/2008 | Szyperski et al. | 324/307 |
| 2007/0057673 | A1 | 3/2007 | Nayak et al. | |
| 2007/0225591 | A1 | 9/2007 | Derbyshire et al. | |
| 2010/0237861 | A1 * | 9/2010 | Hennel | 324/307 |
| 2010/0286500 | A1 * | 11/2010 | Ruhm | 600/410 |
| 2011/0001476 | A1 * | 1/2011 | Morrell | 324/309 |
| 2011/0018537 | A1 * | 1/2011 | Warntjes | 324/309 |
| 2011/0213235 | A1 * | 9/2011 | Arai | 600/410 |

OTHER PUBLICATIONS

Kyunghyun Sung and Krishna S. Nayak, $B_1+$ Compensation in 3T Cardiac Imaging Using Short 2DRF Pulses, Magnetic Resonance in Medicine 59:441-446 (2008).

(Continued)

*Primary Examiner* — Brij B Shrivastav
(74) *Attorney, Agent, or Firm* — McDermott Will & Emery LLP; James W. Hill; Eugene R. Worley

(57) ABSTRACT

The disclosure provides phase-sensitive methods of radio frequency field mapping (e.g., $B_1$ mapping), in which flip angle is encoded in the phase of a transverse magnetization produced by a series of RF pulses. The phase-sensitive methods can measure flip angle over a wider range than other methods such as double-angle methods. In one aspect, a phase-sensitive method of radio frequency mapping includes acquiring a first transverse magnetization phase measurement using an RF excitation pulse with flip angle $2\alpha$ and acquiring a second transverse magnetization phase measurement using an RF excitation pulse with flip angle $-2\alpha$. The method also includes computing a phase difference between the two phase measurements and generating a radio frequency map based on the phase difference. The radio frequency map may be used, for example, to correct an image for variation in image intensity caused by $B_1$ field inhomogeneity and correct $T_1$ measurements for variations caused by $B_1$ field inhomogeneity.

9 Claims, 8 Drawing Sheets

OTHER PUBLICATIONS

Glen Morrell and Albert Macovski, A Phase-Sensitive Method for B1 Mapping, Apr. 18, 1998.

G. Morrell and M. Schabel, A Noise Analysis of Flip Angle Mapping Methods, Radiology Department, University of Utah Health Sciences Center, Salt Lake City, Apr. 19, 2009.

Vasily L. Yarnykh, Actual Flip-Angle Imaging in the Pulsed Steady State: A Method for Rapid Three-Dimensional Mapping of the Transmitted Radiofrequency Field, Magnetic Resonance in Medicine 57:192-200 (2007).

Morrell G., Rapid Mapping of the RF Field, Fourteenth Meeting ISMRM, Seattle, WA 2626, May 6, 2006.

Insko, E., Bolinger, L., "Mapping of the radiofrequency field", J Magn Reson 1993; 103: 82-85.

Stollberger, R., Wach, P., Imaging of the active B1 field in vivo, Magn Reson Med 1996; 35: 246-251.

Cunningham, C.H., Pauly, J.M., Nayak, K.S., Saturated double-angle method for rapid B1 + Mapping, Magn Reson Med 2006; 55(6): 1326-1333.

Park, H., Kim, Y., Cho, Z., Fast gradient-echo chemical-shift imaging. Magn Reson Med 1988; 7: 340-345.

Song, S., Napel S., Glover G., Phase Unwrapping of MR Phase Images Using Poisson Equation. IEEE Trans Med Imag 1995; 4: 667-676.

* cited by examiner

PHASE SENSITIVE RADIO FREQUENCY MAPPING FOR MAGNETIC RESONANCE IMAGING

STATEMENT REGARDING FEDERALLY SPONSORED RESEARCH OR DEVELOPMENT

This invention was made with government support under Grant #K08 CA112449 awarded by the National Institutes of Health. The Government has certain rights to this invention.

FIELD

This application relates generally to magnetic resonance imaging, and more particularly to radio frequency mapping for magnetic resonance imaging.

BACKGROUND

Inhomogeneity of the radio frequency (RF) field causes variation of flip angle with spatial location. This flip angle variation may result in variable image intensity or failure of flip-angle-sensitive techniques such as fat saturation.

Measurement of flip angle can be used to correct image intensity variation caused by $B_1$ field inhomogeneity. Measurement of flip angle is also useful to obtain correct results in $T_1$ mapping with multiple-flip-angle techniques. Measurement of both flip angle and relative phase of the $B_1$ field is also necessary for the design of RF waveforms for multiple simultaneous transmitter systems.

Mapping of the $B_1$ field has been performed using double angle methods. In these methods, two spin-echo or gradient recalled echo (GRE) acquisitions are performed. In a spin-echo double angle method, a first acquisition $M_1$ is performed with a α-2α sequence, and a second acquisition $M_2$ is performed with a 2α-4α sequence. Dividing the magnitude of the first acquisition by the magnitude of the second acquisition gives a function of flip angle α as follows:

$$\frac{M_1}{M_2} = \frac{1}{8\cos^3\alpha} \quad (1)$$

from which the flip angle α can be calculated as $$\alpha = \sec^{-1}\sqrt[3]{8M_1/M_2} \quad (2)$$

In GRE double angle methods, two GRE acquisitions are performed with flip angles α and 2α. Dividing the magnitudes of the two acquisitions gives a function of flip angle α as follows:

$$\frac{M_1}{M_2} = \frac{1}{2\cos\alpha} \quad (3)$$

Equations (1) and (3) assume that the repetition time (TR)→∞.

Other $B_1$ mapping methods which derive estimates of $B_1$ from signal intensities have been developed. One method utilizes two acquisitions with the same flip angle but alternating variable short sequence repetition time (TR). Another method uses three GRE acquisitions with flip angle distributed around 180° and fits the observed signal intensity to the expected 180° signal null. In another technique, flip angle is calculated from the ratio of a spin echo and a stimulated echo, similar to double angle methods but with both echoes obtained during the same sequence repetition.

SUMMARY

The disclosure provides phase-sensitive methods of radio frequency field mapping (e.g., $B_1$ mapping), in which flip angle is encoded in the phase of a transverse magnetization produced by a series of RF pulses. The phase-sensitive methods can measure flip angle over a wider range than other methods such as double-angle methods.

In one aspect, a phase-sensitive method of radio frequency mapping comprises acquiring a first transverse magnetization phase measurement using an RF excitation pulse with flip angle 2α followed immediately by an RF excitation pulse with flip angle α about an orthogonal axis and acquiring a second transverse magnetization phase measurement using an RF excitation pulse with flip angle −2α followed immediately by an RF excitation pulse with flip angle α about an orthogonal axis. The method further comprises computing a phase difference between the two phase measurements and generating a radio frequency map based on the phase difference. The radio frequency map may be used, for example, to correct an image for variation in image intensity caused by $B_1$ field inhomogeneity. The radio frequency map may also be used to correct $T_1$ measurements for variations caused by $B_1$ field inhomogeneity. The corrected $T_1$ measurements may be used for $T_1$-weighted imaging, which provides contrast between tissues with different $T_1$ relaxation times.

Additional features and advantages of the invention will be set forth in the description below, and in part will be apparent from the description, or may be learned by practice of the invention. The advantages of the invention will be realized and attained by the structure particularly pointed out in the written description and claims hereof as well as the appended drawings.

It is to be understood that both the foregoing summary of the invention and the following detailed description are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute a part of this specification, illustrate aspects of the invention and together with the description serve to explain the principles of the invention.

DETAILED DESCRIPTION

In this disclosure, a $B_1$ field may be a radio frequency magnetic field that is generated by an RF coil and is approximately orthogonal to a main field ($B_0$) of an MRI machine. The $B_1$ field may also oriented at other angles with respect to the main field $B_0$ besides being orthogonal to the main field $B_0$.

Figure 1:
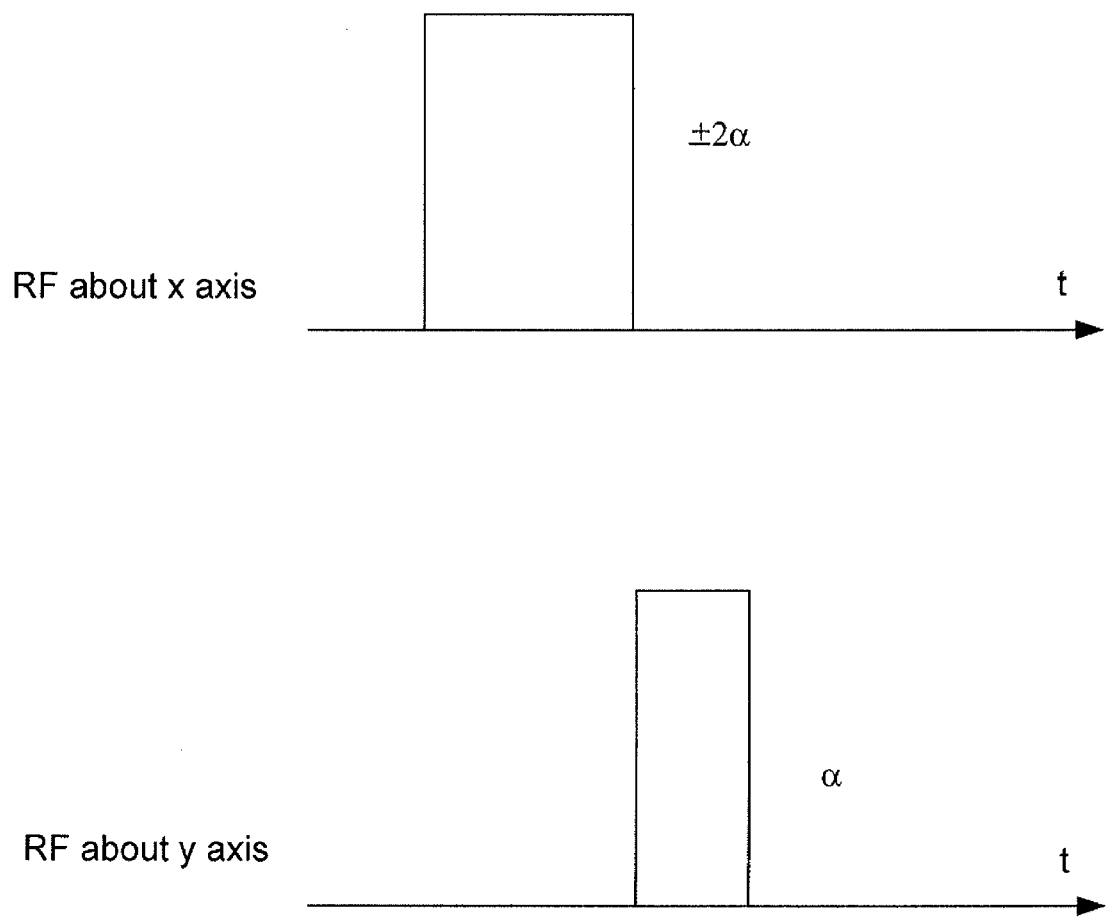
FIG. 1 illustrates a pulse sequence according to certain aspects of the disclosure.

FIG. 1 shows an RF pulse sequence for performing phase-sensitive $B_1$ mapping according to an aspect the disclosure. The pulse sequence in FIG. 1 comprises a nonselective 180° pulse about the x axis followed immediately by a nonselective 90° pulse about the y axis. $B_1$ field inhomogeneity results in the actual flip angles of the two nonselective pulses deviating from 180° and 90° to give unknown angles 2α and α. The ± in FIG. 1 indicates that the first pulse can be inverted, which is described further below.

In the absence of main field ($B_0$) inhomogeneity, the initial 2α pulse about the x axis rotates the initial longitudinal magnetization $M_0$ into the y-z plane. The subsequent α flip about the y axis brings the magnetization toward the transverse (x-y) plane, where the flip angle of the initial 2α pulse is reflected in the phase angle of the resulting transverse magnetization $M_{xy}$.

For the case of zero $B_0$ inhomogeneity, the excitation can be modeled as a constant rectangular excitation pulse with duration 2τ giving a (left-handed) flip angle of $2α_x$ followed by a constant rectangular pulse of duration τ giving a (left-handed) flip angle of $α_y$. Given an initial longitudinal magnetization of $M_0\hat{z}$ and neglecting relaxation effects, this sequence of excitations gives the following resulting magnetization:

$M_x = -M_0 \sin α \cos 2α$ $M_y = M_0 \sin 2α$ $M_z = M_0 \cos α \cos 2α$ (4)

Figure 2:
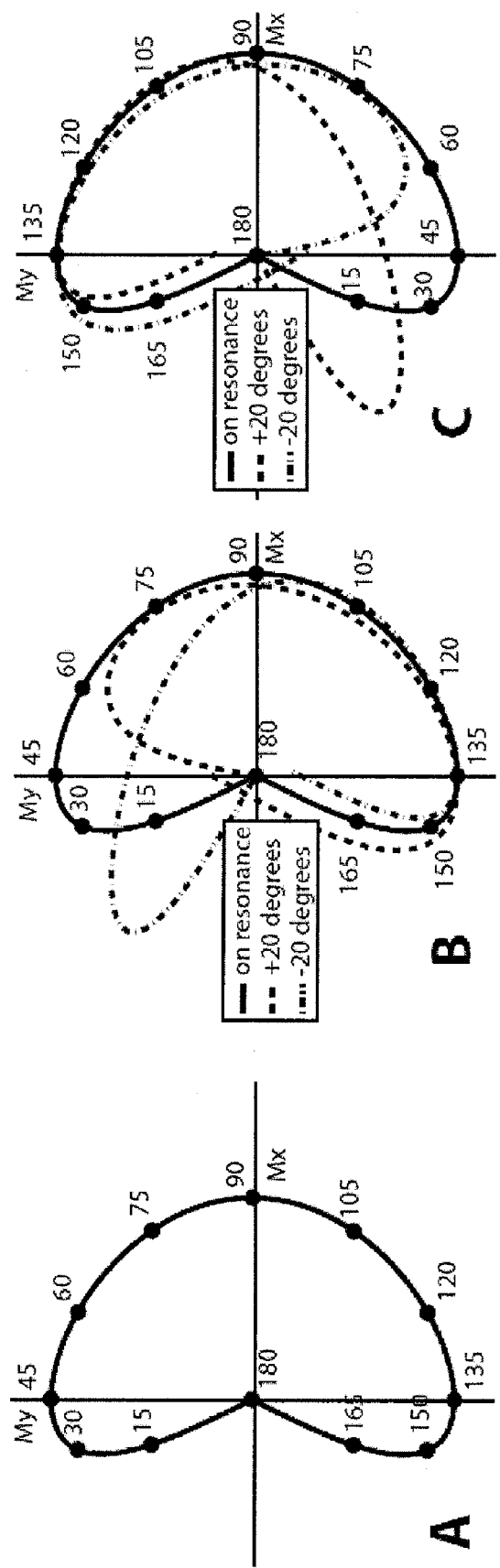
FIG. 2A is a plot of transverse magnetization at various values of flip angle α for spins that are on-resonance with positive 2α initial pulse according to certain aspects of the disclosure.
FIG. 2B is a plot of the transverse magnetization at various values of flip angle α for spins with various off-resonance phase accrual during interval τ with positive 2α initial pulse according to certain aspects of the disclosure.
FIG. 2C is a plot of the transverse magnetization at various values of flip angle α for spins with various off-resonance phase accrual during interval τ with negative 2α initial pulse according to certain aspects of the disclosure.

The transverse component $M_{xy} = M_x + iM_y$ is plotted at different flip angles in FIG. 2A. From FIG. 2A, the phase of $M_{xy}$ is seen to be a good measure of the flip angle α. In FIG. 2A, discrete points of the flip angle are shown in 15 degree intervals.

For nonuniform $B_0$ field, the form of Equation (4) changes. In this case, the first $2α_x$ excitation pulse can be modeled as a left-handed flip of angle $2\sqrt{α^2 + \Delta\omega^2\tau^2}$ about the vector [2α, 0, 2Δωτ], where Δω is off-resonance frequency for a given location in the imaging volume caused by $B_0$ field inhomogeneity or chemical shift. The second $α_y$ excitation pulse can be modeled as a left-handed flip of angle $\sqrt{α^2 + \Delta\omega^2\tau^2}$ about the vector [0, α, Δωτ]. Given initial magnetization $M_0\hat{z}$ and neglecting relaxation, the resulting magnetization is:

$$M_x = \pm \frac{M_0 α \Delta\omega\tau}{β^2}(4\sin^2β\cosβ) - \frac{M_0 α\sinβ}{β^3}(α^2\cos 2β + \Delta\omega^2\tau^2)$$

$$M_y = \pm \frac{M_0 2α\sinβ}{β^3}(\Delta\omega^2\tau^2\cos 2β + α^2\cosβ) +$$

$$\frac{M_0 α\Delta\omega\tau}{β^4}(1 - \cosβ)(α^2\cos 2β + \Delta\omega^2\tau^2)$$

$$M_z = \pm \frac{2M_0 α^2 \Delta\omega\tau\sinβ}{β^3}(\cosβ - \cos 2β) +$$

$$\frac{M_0 α^2\cos 2β + \Delta\omega^2\tau^2}{β^4}(α^2\cosβ + \Delta\omega^2\tau^2)$$

(5)

with $β = \sqrt{α^2 + \Delta\omega^2\tau^2}$ and ± representing + when the pulse in the x axis is 2α. A modification to the pulse sequence in which ± represents − in Equation (5) is described below. The transverse component $M_{xy} = M_x + iM_y$ is plotted for various values of flip angle α and off-resonance precession angle Δωτ in FIG. 2B.

Although $M_{xy}$ varies with off-resonance due to $B_0$ field inhomogeneity, the phase of $M_{xy}$ remains a good function of flip angle α over a wide range of off-resonant frequencies. However, off-resonance frequency Δω must be known for each point in the imaging volume to correctly estimate α from the phase of $M_{xy}$. This requirement can be met by using a rapid gradient-recalled echo sequence to produce a $B_0$ field map.

In practice, the phase of $M_{xy}$ cannot be measured with a single acquisition because the image phase depends on several factors in addition to the flip angle α. For instance, the image phase will reflect retarded potentials of the propagating RF wave within the body as well as the effects of eddy currents. Phase effects from retarded potentials become larger at higher field strengths. These sources of phase can be removed from the measurement of the phase of $M_{xy}$ by a second acquisition in which the $2α_x$ pulse is reversed in sign. In this aspect, the second acquisition is performed with a second pulse sequence comprising a $-2α_x$ excitation pulse about the x axis followed by an $α_y$ excitation pulse. The ± in FIG. 1 indicates that the sign of the excitation pulse about the x axis is reversed in sign for the second acquisition.

The phase of the second acquisition is subtracted from the phase of the first acquisition. This subtraction removes sources of phase other than flip angle α. The transverse magnetization $M_{xy}$ for the first acquisition is denoted as $M_{xy}^+$ and the transverse magnetization $M_{xy}$ for the second acquisition is denoted as $M_{xy}^-$. The difference in phase between the two acquisitions is denoted:

$θ = ∠M_{xy}^+ - ∠M_{xy}^-$ (6)

where phase of $M_{xy}$ is given by $\tan^{-1}(M_y/M_x)$.

For the case of no $B_0$ field inhomogeneity described by Equation (4), changing the sign of the $2\alpha_x$ pulse changes only the sign of $M_y$, leaving $M_x$ and $M_z$ unchanged. Thus $\angle M_{xy}^- = -\angle M_{xy}^+$ and the phase difference $\theta$ is given by:

$$\theta = \angle M_{xy}^+ - \angle M_{xy}^- = 2\angle M_{xy}^+ \tag{7}$$

When $B_0$ field inhomogeneity is present, the expression for $\theta$ becomes more complicated. The transverse magnetization for the second acquisition, with the initial $2\alpha$ excitation reversed in sign, is given by Equation (5) where ± terms represent −. The resulting transverse magnetization $M_{xy}$ is shown in FIG. 2C for a range of flip angles and off-resonance precession angles.

Figure 3:
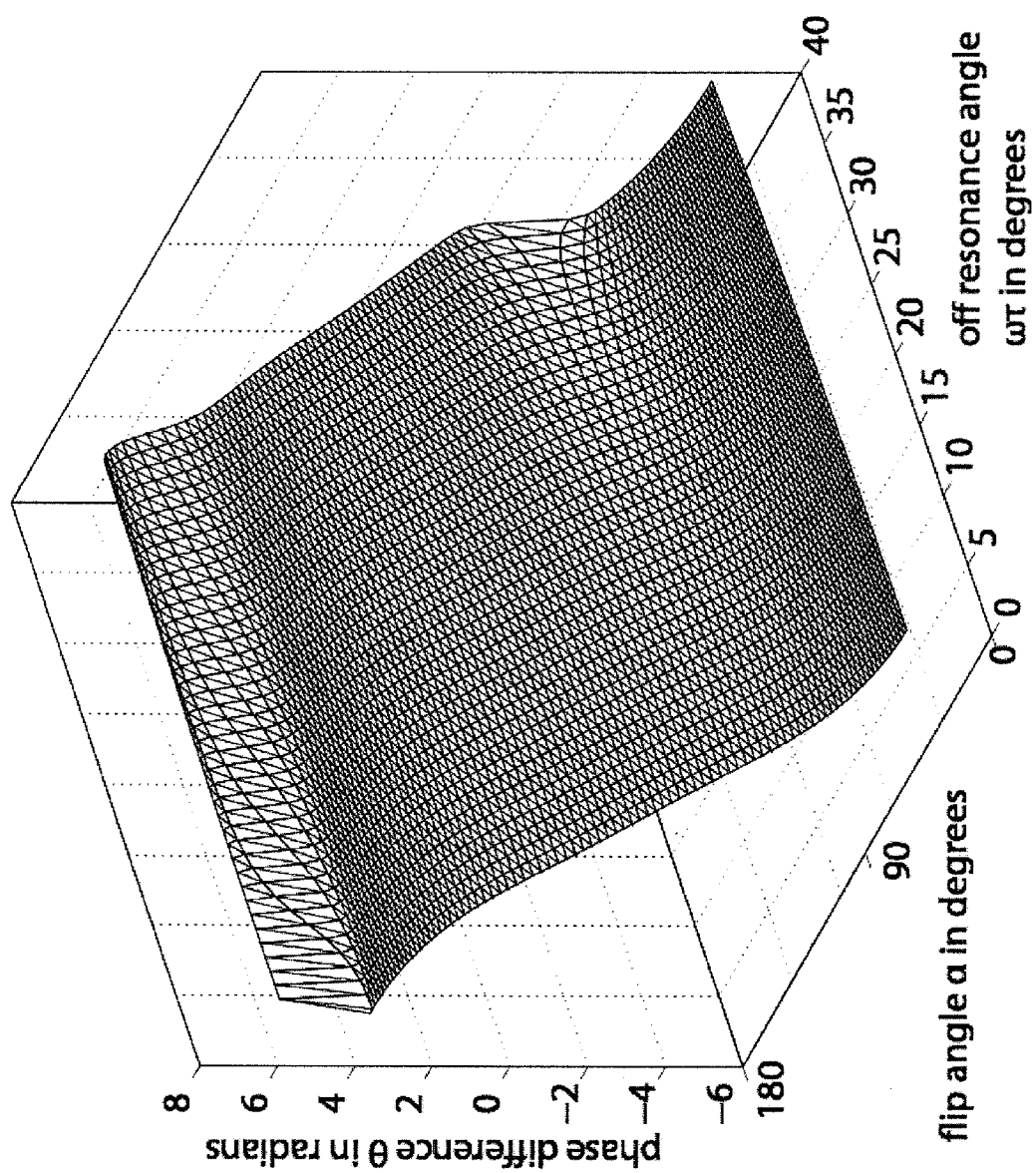
FIG. 3 is a plot of phase difference θ as a function of flip angle α and off-resonance phase accrual according to certain aspects of the disclosure.

The phase difference $\theta$ is plotted for a range of flip angles $\alpha$ and a range of off-resonance accrual angles $\Delta\omega\tau$ in FIG. 3. As shown in FIG. 3, the phase difference $\theta$ is an excellent function of flip angle $\alpha$, giving a nearly linear relationship between $\theta$ and $\alpha$ over a wide range of off-resonance phase accrual angles $\Delta\omega\tau$. The phase difference $\theta$ may range over values greater than $2\pi$ if the flip angle varies over a range greater than about 90°. In this case, phase unwrapping may be necessary to measure flip angles in the range of 0°-45° and in the range of 135°-180°.

In one aspect, the phase-sensitive $B_1$ mapping method described above was implemented with both GRE and echo-planar readout schemes. Phase unwrapping of $\theta$ was performed for studies showing greater than 90° variation in $\alpha$ using a method based on the solution of the Poisson equation. Because the closed form expression of $\theta$ is quite complicated, a lookup table of calculated values of $\theta$ versus $\alpha$ for the appropriate value of $\Delta\omega\tau$ was used to form the estimate of $\alpha$ at each image location.

Equation (5) shows that the sign and magnitude of $M_z$ at the end of the excitation will vary with flip angle $\alpha$, and some values of $\alpha$ will result in negative values of $M_z$. A series of (nominally) 90° tips followed by large dephasing gradient lobes were used at the end of the acquisition window to allow saturation recovery of $M_z$ from zero rather than a negative value.

Figure 4:
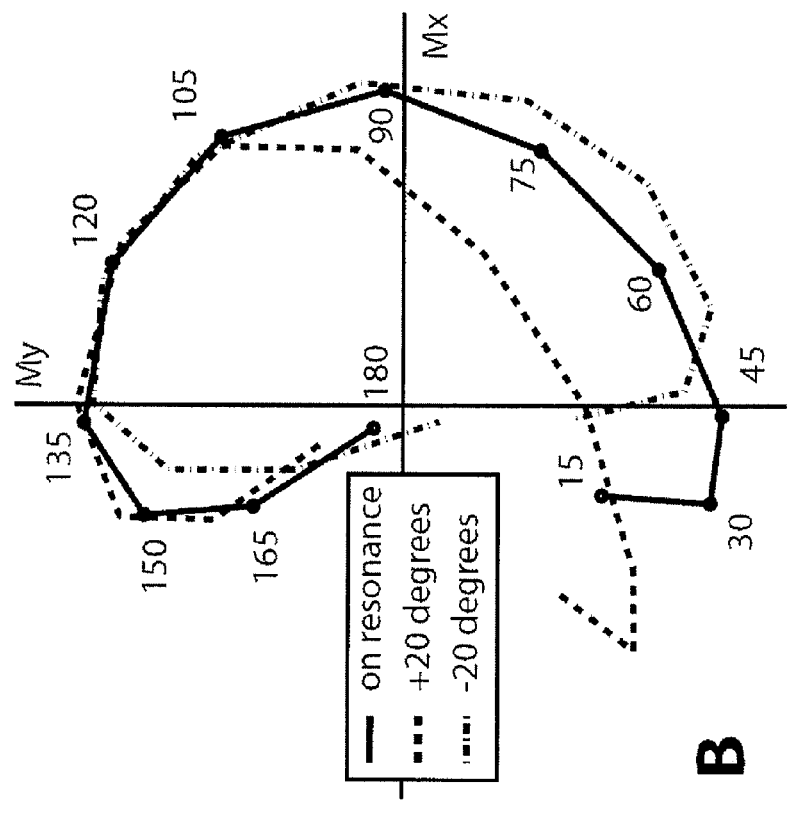
FIG. 4A is a plot of measured transverse magnetization in a phantom experiment at various values of flip angle α with positive 2α initial pulse according to certain aspects of the disclosure.
FIG. 4B is a plot of measured transverse magnetization in a phantom experiment at various values of flip angle α with negative 2α initial pulse according to certain aspects of the disclosure.
Figure 4:
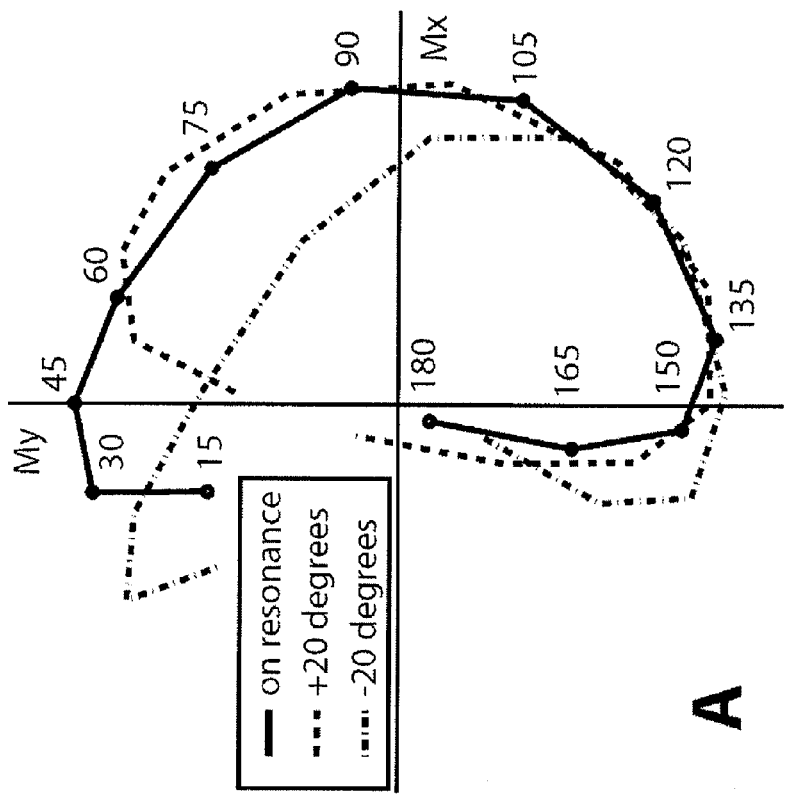

Experimental verification of Equation (5) was performed by running the $B_1$ mapping sequence with GRE acquisition and long TR on a small vial of copper sulfate doped agar within a receive-only head coil of a 3.0T Siemens Trio imaging system. Excitation was performed with the body coil. Because of the small size of the phantom, nearly uniform flip angle was achieved over the phantom volume. The sequence was run with positive $2\alpha$ flip about x axis, and the resulting transverse magnetization $M_{xy}$ averaged over a volume of the phantom was measured for various values of $\alpha$, the results of which are shown in FIG. 4A. Extraneous phase was removed from the plot of $M_{xy}$ in FIG. 4A by subtraction of a phase reference scan, which was performed by applying only the second a flip about y, without the preceding $2\alpha$ flip about x. The phase of this phase reference scan was subtracted from $M_{xy}$ for the purpose of depiction in FIG. 4A. The sequence was then repeated over the same range of values of $\alpha$ with the system frequency offset by +111 Hz and again by −111 Hz to demonstrate the effect of off-resonance on the transverse magnetization $M_{xy}$. For the pulse length and sequence timing used for this test, setting the transmitter frequency to +111 Hz resulted in accrual of −20° of phase during the interval $\tau$, while the offset of −111 Hz resulted in accrual of +20° of phase. Plots of $M_{xy}$ versus flip angle for these values of off-resonance are included in FIG. 4A. The same phantom experiment was then performed with initial flip of −2α, the results of which are shown in FIG. 4B.

A phantom study was performed to map the RF field of a commercially available transmit-receive extremity imaging coil on the 3T Siemens Trio imaging system. For this experiment, a phantom was constructed which nearly filled the bore of the coil. The phantom was filled with agar which was doped with copper sulfate to give an approximate $T_1$ of 260 ms and approximate $T_2$ of 50 ms. The phantom was also doped with a physiologic concentration of NaCl to simulate coil loading by soft tissue. The phase-sensitive $B_1$ mapping method was used to image in the axial plane (shown in FIG. 5A) with an echo-planar readout (128×128×32 3D matrix size, 18×18×32 cm FOV, echo train length of 3, TR=150 ms, TE=6.6 ms, $\tau$=500 μsec, imaging time 3:24 for each of two acquisitions for total imaging time of 6:48). Comparison was made to the spin-echo double echo method over the same imaging volume with a multislice 2D spin echo sequence (128×128 2D matrix, 24 slices, 35×26.5×35 cm FOV, TR=700 ms, TE=13 ms, imaging time 2:58 for each of two acquisitions for total imaging time of 5:56). The $B_1$ field of the same coil was imaged with the same phantom in the sagittal plane with the phase-sensitive technique (GRE readout, 128×71×16 3D matrix size, 18×32×16 cm FOV, TR=150 ms, TE=6.6 ms, imaging time 2:53 for each of two acquisitions for total imaging time of 5:46) and compared to the spin-echo double angle method (multislice spin echo sequence, 128×70 2D matrix, 24 slices, 18×32×24 cm FOV, TR=700 ms, TE=13 ms, $\tau$=200 μsec, imaging time 1:41 for each of two acquisitions for total imaging time of 3:22).

FIGS. 5A and 5B show the resulting $B_1$ map obtained by the phase-sensitive method and double angle method in the axial plane, respectively. The contour lines represent increments of 10° in flip angle. Note the smaller range of depicted flip angles in FIG. 5B and erroneous measurement in FIG. 5B of regions of greater than 90° flip angle at the edges of the phantom, near the coil elements.

FIGS. 6A and 6B show the resulting $B_1$ map obtained by the phase-sensitive method and double angle method in the sagittal plane, respectively. The contour lines represent increments of 10° in flip angle. Note the smaller range of depicted angle sin FIG. 6B and visible susceptibility to noise in FIG. 6B at regions of low flip angle.

An in vivo $B_1$ mapping experiment was performed with the phase-sensitive method, showing the flip angle achieved by a commercially available transmit-receive head coil in a healthy volunteer. This study was performed with written informed consent under the direction of the local Institutional Review Board (IRB). For this experiment, a 3D GRE acquisition was performed (64×51×32 matrix size, 22×17.9×32 cm FOV, TR=121 ms, TE=5.3 ms, imaging time 3:20 for each of two acquisitions for total imaging time of 6:40). FIG. 7A shows the result of this experiment for a single representative axial slice in the brain. In FIG. 7A, units of flip angles are degrees. A nominal flip angle of 90° was specified. The in-plane resolution is 3.5×3.5 mm, with slice thickness of 1 cm. FIG. 7A is a GRE $T_1$ image of the same axial slice for anatomic reference.

FIGS. 4A and 4B shows the results of the phantom study demonstrating $M_{xy}$ as a function of flip angle for various values of off-resonance precession $\omega\tau$. FIG. 4A shows the transverse magnetization $M_{xy}$ for initial flip of $+2\alpha$, while FIG. 4B shows $M_{xy}$ for initial flip of $-2\alpha$. Comparison with the theoretical values of $M_{xy}$ in FIGS. 2B and 2C shows good agreement.

Figure 5:
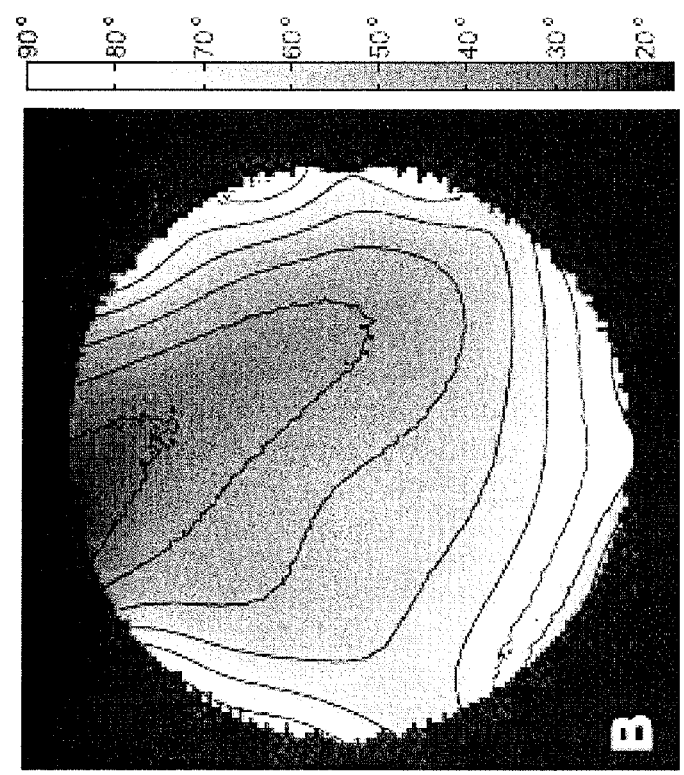
FIG. 5A illustrates a flip angle map of a central axial slice of a phantom in a transmit-receive extremity coil obtained by a phase-sensitive method according to certain aspects of the disclosure.
FIG. 5B illustrates a flip angle map of the same location as FIG. 5B obtained by a double-angle method.
Figure 5:
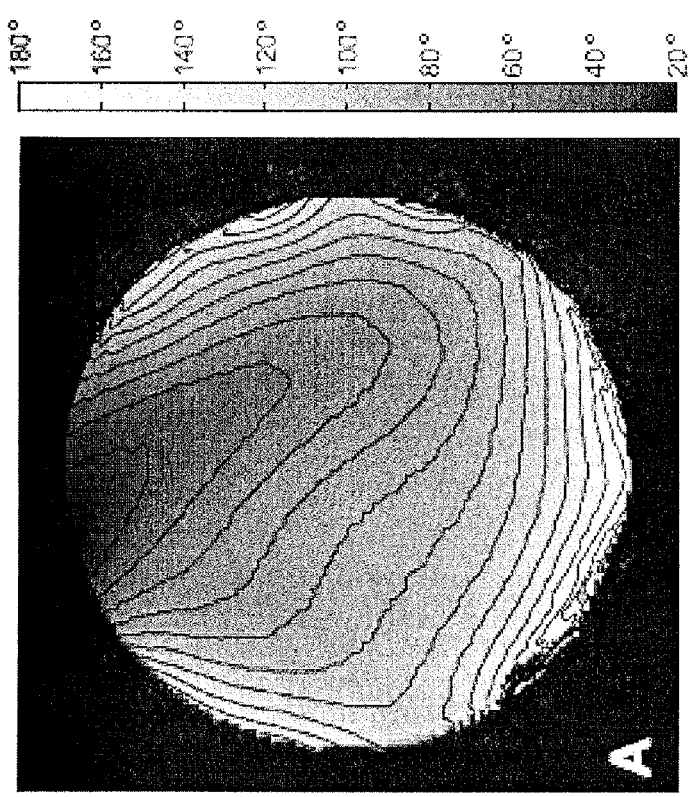
Figure 6:
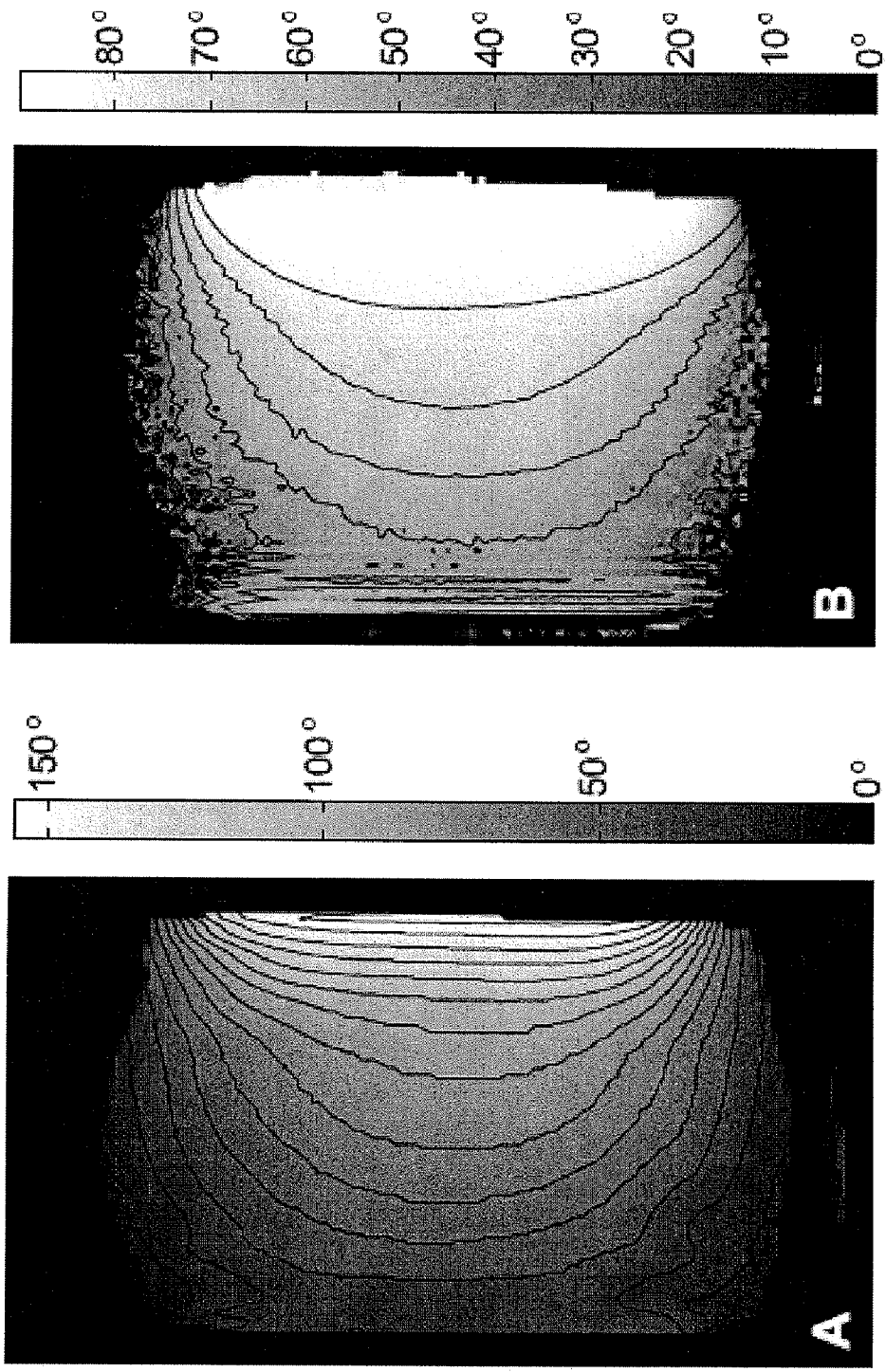
FIG. 6A illustrates a flip angle map in a sagittal plane through the same phantom and coil in FIG. 5A obtained by a phase-sensitive method according to certain aspects of the disclosure.
FIG. 6B illustrates a flip angle map of the same location as FIG. 6B obtained by a double-angle method.

FIGS. 5 and 6 show the results of phantom studies performed on a commercial transmit-receive extremity coil, with $B_1$ maps formed by the phase-sensitive method and by the spin-echo double angle method for comparison. The phase-sensitive technique was performed with a nominal flip angle of 90°, while the double angle technique was performed for a nominal flip angle of 60° to avoid the singularity at 90° encountered by this method.

Figure 7:
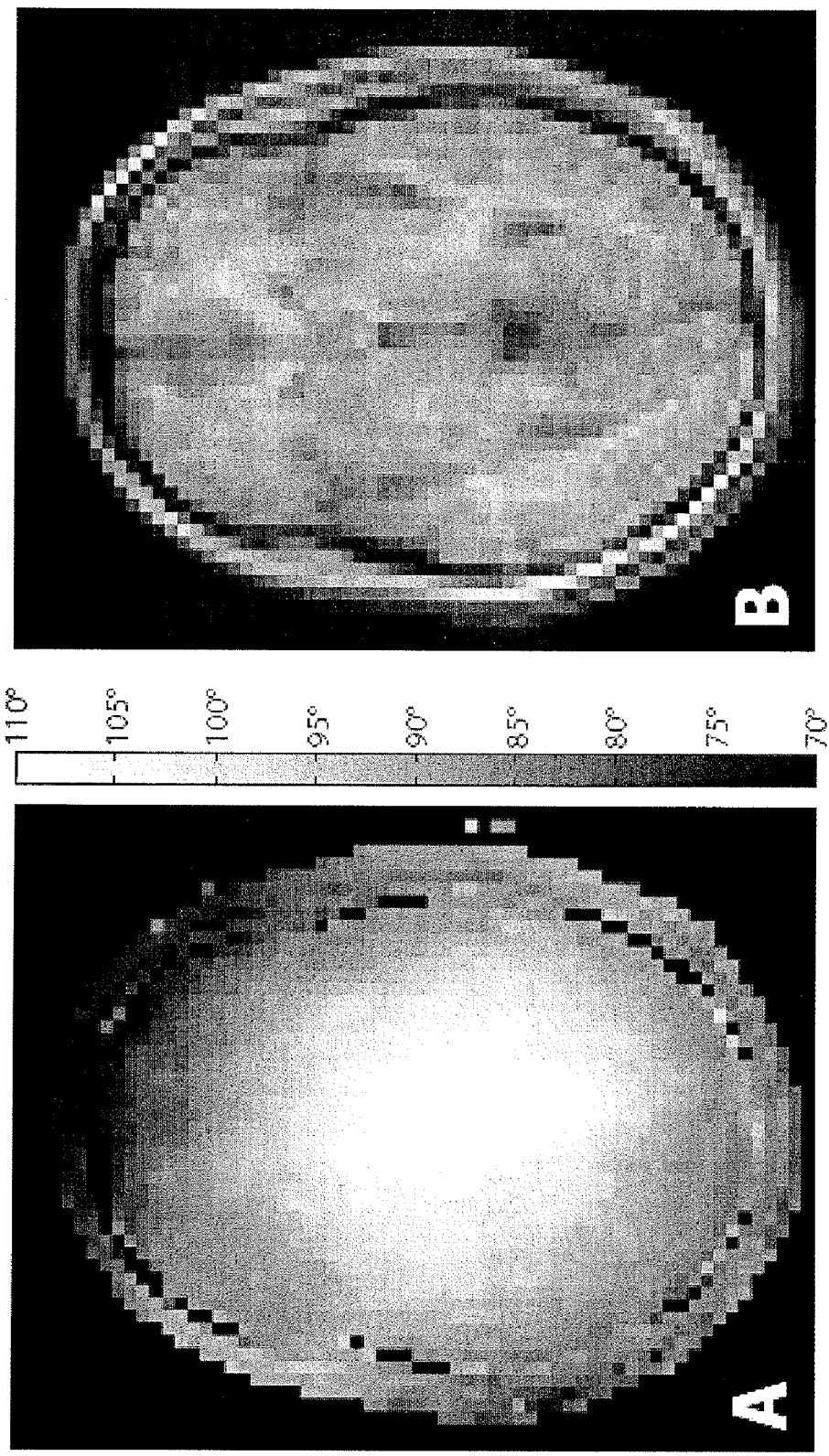
FIG. 7A illustrates a representative axial slice of a 3D $B_1$ map of a healthy brain obtained by a phase-sensitive method according to certain aspects of the disclosure.
FIG. 7B illustrates a GRE $T_1$ image of the same axial slice in FIG. 7A for anatomic reference.

FIG. 7 shows the result of an in vivo experiment mapping the flip angle of a commercially available transmit-receive head coil for a representative axial slice in a volunteer brain. The nominal flip angle was 90°. A range of actual flip angles from about 70° to 110° is demonstrated.

The phantom studies shown in FIGS. 5 and 6 illustrate some of the advantages of the phase-sensitive method over the double angle method.

The phase-sensitive method is able to measure a much wider range of flip angles than the double angle method. FIG. 5A shows the phase sensitive method performed with a nominal flip angle of α=90°, giving a measured range of flip angles ranging from 20° to almost 180°. This range of flip angle measurement is not possible with the double angle method. Because Equation (1) is singular for α=90°, flip angles around 90° are poorly measured with the double angle technique. For this reason, the double angle method was performed in FIGS. 5B and 6B with nominal flip angle of α=60°. Actual flip angles greater than 90° map to values less than 90° with the double angle method. This phenomenon is seen in FIG. 5B. The double angle method shows increasing flip angle from the center of the phantom toward the bottom, increasing to a maximum of 90°, and then decreasing toward the inferior periphery of the phantom. The correct flip angle depicted by the phase-sensitive method in FIG. 5A increases all the way to the phantom edge. It is possible to measure flip angles greater than 90° with double angle techniques if the method is modified to take image phase into account.

Because the ratio $M_1/M_2$ used in the double angle method to calculate flip angle α varies slowly near α=0°, the double angle method is sensitive to noise at low flip angles. This poor performance at low flip angles is well demonstrated in FIG. 6B, where flip angle estimate with the double angle technique is quite noisy while the flip angle estimate by the phase-sensitive method is robust. Performance of the phase sensitive method degrades below flip angles of about 20°, as the phase difference θ becomes a less sensitive function of flip angle.

The phase-sensitive $B_1$ mapping method according to aspects of the disclosure and existing double angle methods are equivalent with respect to imaging time for 3D imaging. Both have magnetization preparation steps with similar TR requirements. Both can be followed by a variety of readout schemes. Imaging time depends primarily on the readout scheme used. For ease of implementation, the phase-sensitive method has been demonstrated with gradient recalled echo readout and with echo-planer readout with short echo train length. These readout schemes are not optimal for imaging time but have allowed straightforward implementation and demonstration of the performance of the phase-sensitive $B_1$ mapping method. Imaging time may be reduced by implementation of faster acquisition schemes such as echo-planar readout with longer echo train lengths or spiral echo-planar readout.

$B_1$ measurement with either the phase-sensitive method or with existing double angle methods requires relatively long TR. With double angle methods, $B_1$ maps are formed by measuring the magnitude of the signal after α or 2α excitation. This signal amplitude depends on $T_1$, TR, and the flip angles of preceding excitations. The effects of the preceding $T_1$ and preceding excitation history can be removed by using very long TR, typically greater than 5 times the maximum $T_1$ expected in the sample. Alternatively, presaturation has been performed with a recovery period before to the double angle excitation, to allow "resetting" of the longitudinal magnetization to zero before each excitation. This allows shortening of the TR without affecting the validity of the $B_1$ estimate. Shortening TR allows less time for signal regeneration after presaturation, lowering the signal-to-noise ratio. Thus, relatively long TR is still necessary to allow signal regeneration for adequate $B_1$ estimation with double angle methods.

The phase-sensitive method of $B_1$ mapping is largely independent of $T_1$, TR, and prior excitation history because only the phase of the transverse magnetization is used to form the $B_1$ estimate. The signal magnitude does not enter into the calculation of flip angle with this method. However, for some flip angles the longitudinal magnetization Mz available at the beginning of a sequence repetition has been inverted by the prior excitation, giving inverted phase of transverse magnetization on the subsequent excitation. Thus, if the phase-sensitive method is used with short TR, the measured phase from which the $B_1$ map is calculated will oscillate with each acquisition by $+/-\pi$ for some flip angles. This oscillation may be more a tractable problem than the complicated dependence of signal magnitude on $T_1$, TR, and prior excitation history which is faced by double angle methods at low TR. It is possible that this oscillation can be taken into account to allow the phase sensitive method to be used with short TR. However, straightforward implementation of the phase-sensitive method, like the double angle methods, requires either long TR relative to the maximum expected $T_1$ or presaturation to remove the effect of the prior excitation on the sign of Mz. For the results discussed in this disclosure, presaturation was performed as described above.

Because both the double angle and phase-sensitive $B_1$ mapping methods require moderately long TR, imaging speed with either of these methods relies primarily on the acquisition scheme used. Presaturated double angle $B_1$ mapping with reduced imaging time has been achieved by using slice selective excitation and rapid spiral data acquisition. This rapid readout scheme could be applied to the phase-sensitive method to give a similar reduction of imaging time.

In aspects of the disclosure, the phase-sensitive method is applicable to 3D imaging, as the RF pulses are nonselective. Nonselective excitation is used to minimize the duration of excitation, to allow $B_1$ mapping over a wide range of $B_0$ inhomogeneity. Nonselective excitation necessitates large imaging volumes, which leads to low resolution or long scan time. Slab selective excitation with high bandwidth pulses for spatially localized 3D imaging could be implemented in the phase-sensitive method for greater ease and flexibility of scan volume prescription. This would cause some increase in RF pulse length, with some resulting narrowing of the range of $B_0$ inhomogeneity over which the method is valid.

Figure 8:
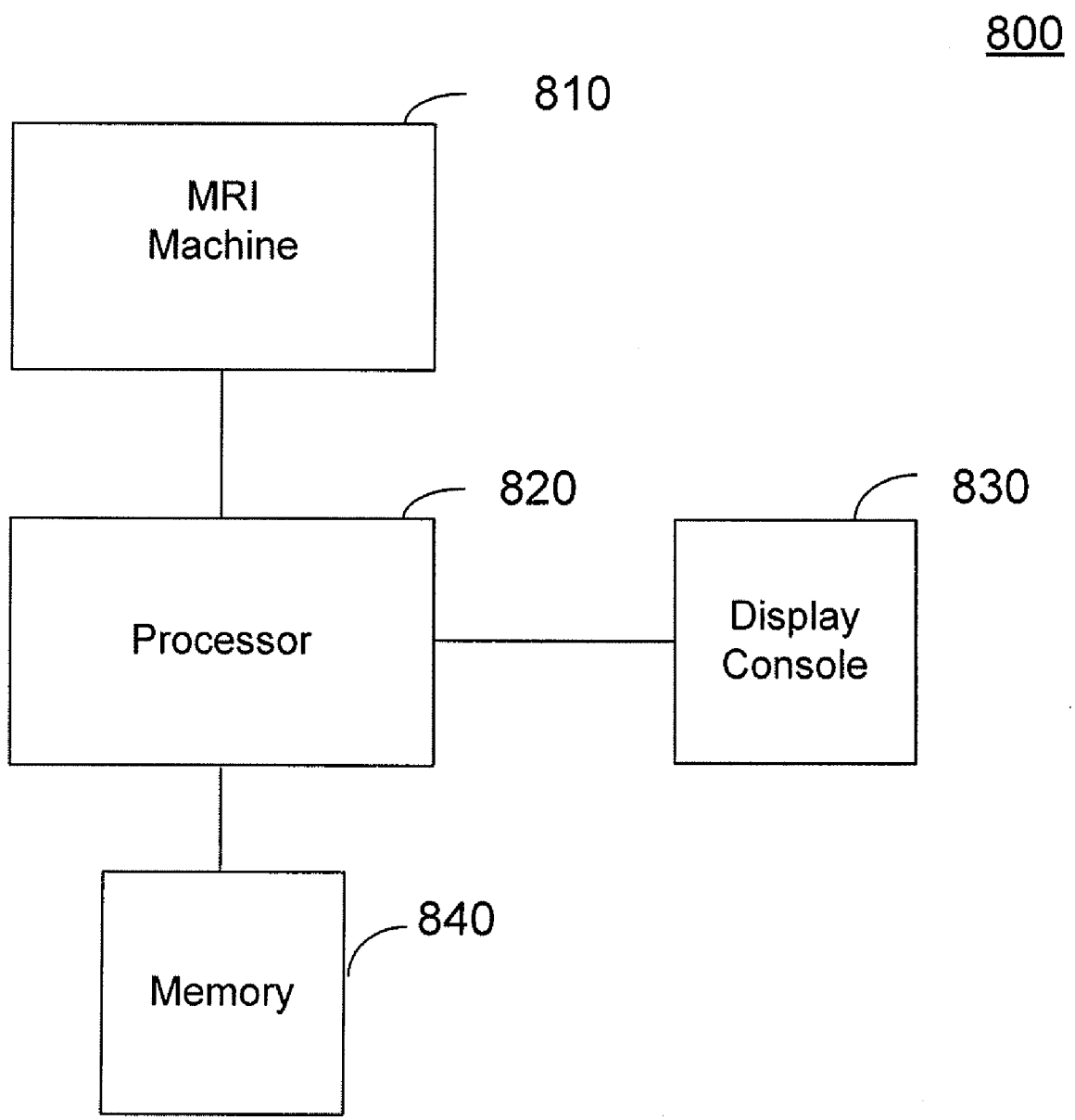
FIG. 8 is a block diagram of an exemplary system for performing a phase-sensitive method according to certain aspects of the disclosure.

FIG. 8 shows an exemplary imaging system 800 that can be used to perform the phase-sensitive method of $B_1$ mapping according to aspects of the disclosure. The imaging system 800 includes an MRI machine 810, a processor 820 and a display console 830. The MRI machine 810 may comprise, for example, a Siemens 3T Trio MRI system, which was used in the experiments described above. The processor 820 may configured to perform the phase-sensitive method, for example, by instructing the MRI machine 810 to perform two acquisitions using two pulse sequences described above, in which the first pulse sequence has an initial pulse with flip angle 2α followed by a pulse of flip angle α in an orthogonal axis and the second pulse sequence has an initial pulse with flip angle −2α followed by a pulse of flip angle α in the orthogonal axis. The MRI machine 810 may then readout the resulting transverse magnetization phase for each pulse sequence and output the two phase readouts to the processor 820. The processor 820 may then compute the phase difference θ between the two phase readouts and perform $B_1$ mapping using the phase difference θ based on of the dependence of the phase difference θ on flip angle (an example of which is shown in FIG. 3). The processor 820 may apply the resulting $B_1$ map to an MRI image to correct for variation in the image intensity caused by $B_1$ field inhomogeneity and output corrected image on the display console 830 to a physician or other health care professional. The processor 820 may also apply the resulting $B_1$ map to an $T_1$ map to correct the $T_1$ map for variations caused by $B_1$ field inhomogeneity. The system 800 may also include memory 840 communicatively coupled to the processor 820, such as a volatile or non-volatile memory, for storing data and/or instructions for software programs. The instructions may include program code that can be executed by the processor 820 to perform methods discussed above according to aspects of the disclosure.

Those skilled in the art will appreciate that the systems and methods described in connection with the embodiments disclosed herein may be implemented or performed with general purpose processors, a digital signal processors (DSPs), application specific integrated circuit (ASICs), field programmable gate array (FPGAs), logic programmable devices, discrete hardware components, or any combination thereof. Further, the algorithms performed by the RF coils, gradient coils, and associated amplifiers and controllers may be embodied in software executed by a processor, directly in hardware, or a combination thereof. The software may be stored in memory or any computer-readable storage medium known in the art.

Those of skill in the art would appreciate that the various illustrative blocks, modules, elements, components, methods, and algorithms described herein may be implemented as electronic hardware, computer software, or combinations of both. Furthermore, these may be partitioned differently than what is described. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application.

It is understood that the specific order or hierarchy of steps or blocks in the processes disclosed is an illustration of exemplary approaches. Based upon design preferences, it is understood that the specific order or hierarchy of steps or blocks in the processes may be rearranged. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." All structural and functional equivalents to the elements of the various aspects described throughout this invention that are known or later come to be known to those of ordinary skill in the art are expressly incorporated herein by reference and are intended to be encompassed by the claims. Moreover, nothing disclosed herein is intended to be dedicated to the public regardless of whether such invention is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A phase-sensitive method of radio frequency field mapping for magnetic resonance imaging, the method comprising:

acquiring a first transverse magnetization phase measurement of a subject from an MRI machine using an RF pulse with flip angle 2α about one axis followed by an RF pulse with a flip angle of α about an axis orthogonal to the one axis;

acquiring a second transverse magnetization phase measurement using an RF pulse with flip angle −2α about the one axis followed by a second RF pulse with a flip angle of α about the axis orthogonal to the one axis;

computing a phase difference between the two phase measurements; and generating a radio frequency map based on the phase difference.

2. The method of claim 1, wherein the radio frequency field is approximately transverse to a main permanent magnetic field of the MRI machine.

3. The method of claim 1, further comprising applying the radio frequency map to a magnetic resonance image to correct variations in image intensity caused by $B_1$ field inhomogeneity.

4. The method of claim 1, further comprising apply the radio frequency map to $T_1$ measurements to correct variations in the $T_1$ measurements caused by $B_1$ field inhomogeneity.

5. A system for performing radio frequency mapping for magnetic resonance imaging, the method comprising:

a processor configured to acquire a first transverse magnetization phase measurement of a subject from an MRI machine using an RF pulse with flip angle 2α about one axis followed by an RF pulse with a flip angle of α about an axis orthogonal to the one axis, to acquire a second transverse magnetization phase measurement from the MRI machine using an RF pulse with flip angle −2α about the one axis followed by a second RF pulse with a flip angle of α about the axis orthogonal to the one axis, to compute a phase difference between the two phase measurements, and to generate a radio frequency map based on the phase difference.

6. The system of claim 5, wherein the radio frequency field is approximately transverse to a main permanent magnetic field of the MRI machine.

7. The system of claim 5, wherein the processor is configured to apply the radio frequency map to a magnetic resonance image to correct variations in image intensity caused by $B_1$ field inhomogeneity.

8. The system of claim 7, wherein the processor is configured to output the corrected magnetic resonance image to a display.

9. The system of claim 5, wherein the processor is configured to apply the radio frequency map to $T_1$ measurements to correct variations in the $T_1$ measurements caused by $B_1$ field inhomogeneity.

* * * * *